United States Patent
Baumann et al.

(10) Patent No.: US 7,574,959 B2
(45) Date of Patent: *Aug. 18, 2009

(54) RADIATION-SENSITIVE COMPOSITIONS AND IMAGEABLE ELEMENTS BASED THEREON

(75) Inventors: Harald Baumann, Osterode (DE); Udo Dwars, Osterode (DE); Michael Flugel, Osterode (DE)

(73) Assignee: Kodak Graphic Communications, GmbH, Osterode (DE)

( * ) Notice: Subject to any disclaimer, the term of this patent is extended or adjusted under 35 U.S.C. 154(b) by 449 days.

This patent is subject to a terminal disclaimer.

(21) Appl. No.: 10/580,357

(22) PCT Filed: Nov. 18, 2004

(86) PCT No.: PCT/EP2004/013138

§ 371 (c)(1),
(2), (4) Date: May 23, 2006

(87) PCT Pub. No.: WO2005/054952

PCT Pub. Date: Jun. 16, 2005

(65) Prior Publication Data

US 2007/0142490 A1  Jun. 21, 2007

(30) Foreign Application Priority Data

Dec. 5, 2003  (DE) .............................. 103 56 847

(51) Int. Cl.
G03C 1/73 (2006.01)
B32B 17/06 (2006.01)
C08J 7/04 (2006.01)
B41N 1/00 (2006.01)

(52) U.S. Cl. .................... 101/453; 427/510; 428/425.1; 430/281.1; 430/284.1; 522/25; 522/26; 522/171; 522/173; 522/28

(58) Field of Classification Search .............. 430/284.1, 430/282.1; 522/25, 26, 28, 173; 427/510; 428/425.1; 101/453

See application file for complete search history.

(56) References Cited

U.S. PATENT DOCUMENTS

| | | | | |
|---|---|---|---|---|
| 3,686,371 | A * | 8/1972 | Hasegawa | 558/114 |
| 4,243,741 | A * | 1/1981 | Abele et al. | 430/270.1 |
| 5,506,326 | A * | 4/1996 | Kneafsey | 526/320 |
| 5,567,761 | A * | 10/1996 | Song | 524/523 |
| 7,175,949 | B1 * | 2/2007 | Tao et al. | 430/17 |
| 7,182,039 | B2 * | 2/2007 | Ichimura et al. | 116/167 |
| 2003/0186165 | A1 | 10/2003 | Gries et al. | |
| 2006/0234155 | A1* | 10/2006 | Baumann et al. | 430/270.1 |
| 2007/0148583 | A1* | 6/2007 | Timpe et al. | 430/270.1 |
| 2008/0145790 | A1* | 6/2008 | Baumann et al. | 430/302 |

FOREIGN PATENT DOCUMENTS

| | | | |
|---|---|---|---|
| DE | 287 796 | | 3/1991 |
| DE | 102004022137 | B3 * | 9/2005 |
| EP | 0534005 | A1 * | 3/1993 |
| EP | 0 573 805 | | 12/1993 |
| WO | WO 2004074930 | A2 * | 9/2004 |
| WO | WO 2004111731 | A1 * | 12/2004 |
| WO | WO 2007135894 | A1 * | 11/2007 |

OTHER PUBLICATIONS

EP 0 573 805 English Abstract.

* cited by examiner

Primary Examiner—Susan W Berman
(74) Attorney, Agent, or Firm—J. Lanny Tucker

(57) ABSTRACT

Radiation-sensitive composition comprising (a) at least one photopolymerizable compound with at least one ethylenically unsaturated group accessible to a free-radical polymerization, wherein the at least one photopolymerizable compound has a molecular weight of 3,000 or less and can be obtained by reacting a diisocyanate with (I) an ethylenically unsaturated compound with a hydroxy group, and at the same time (ii) a saturated organic compound with an NH group and an OH group, wherein the reactants are used in amounts according to the following condition: Number of moles of isocyanate groups ≦number of moles of OH plus NH groups; (b) at least one sensitizer which absorbs radiation from the wavelength range of 250 to 450 nm of the electromagnetic spectrum and is selected from: dihydropyridines of formula (I) and oxazole derivatives of formula (II): (II) (c) at least one coinitiator capable of forming free radicals together with the sensitizer (b) and selected from 2,2',4,4',5'5-hexaarylbiimidazoles, compounds with at least one photolytically cleavable trihalogenmethyl group, diaryliodonium salts, triarylsulfonium salts and N-heterocyclic compounds with at least one nitrogen atom in the ring, having an oxy substituent at least one ring nitrogen atom, and mixtures of the above compounds; and (d) optionally one or more components selected from alkali-soluble binders, colorants, exposure indicators, plasticizers, chain transfer agents, leuco dyes, surfactants, inorganic fillers and thermopolymerization inhibitors; with the proviso that the radiation-sensitive composition does not comprise a metallocene.

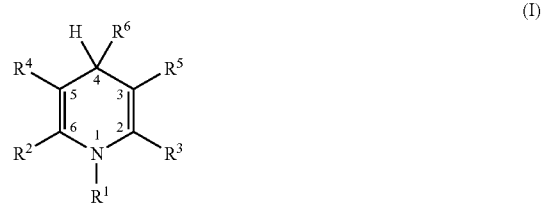

(I)

18 Claims, No Drawings

RADIATION-SENSITIVE COMPOSITIONS AND IMAGEABLE ELEMENTS BASED THEREON

The present invention relates to radiation-sensitive compositions. The present invention furthermore relates to negative working imageable elements based thereon, a process for the production of such elements, a process for imaging such elements and an imaged element, such as e.g. a lithographic printing form.

The technical field of lithographic printing is based on the immiscibility of oil and water, wherein the oily material or the printing ink is preferably accepted by the image area, and the water or fountain solution is preferably accepted by the non-image area. When an appropriately produced surface is moistened with water and a printing ink is applied, the background or non-image area accepts the water and repels the printing ink, while the image area accepts the printing ink and repels the water. The printing ink in the image area is then transferred to the surface of a material such as paper, fabric and the like, on which the image is to be formed. Generally, however, the printing ink is first transferred to an intermediate material, referred to as blanket, which then in turn transfers the printing ink onto the surface of the material on which the image is to be formed; this technique is referred to as offset lithography.

A frequently used type of lithographic printing plate precursor comprises a photosensitive coating applied onto a substrate on aluminum basis. The coating can react to radiation such that the exposed portion becomes so soluble that it is removed during the developing process. Such a plate is referred to as positive working. On the other hand, a plate is referred to as negative working if the exposed portion of the coating is hardened by the radiation. In both cases, the remaining image area accepts printing ink, i.e. is oleophilic, and the non-image area (background) accepts water, i.e. is hydrophilic. The differentiation between image and non-image areas takes place during exposure, for which a film is attached to the printing plate precursor under vacuum in order to guarantee good contact. The plate is then exposed by means of a radiation source. Alternatively, the plate can also be exposed digitally without a film, e.g. with a UV laser. When a positive plate is used, the area on the film corresponding to the image on the plate is so opaque that the light does not reach the plate, while the area on the film corresponding to the non-image area is clear and allows light to permeate the coating, whose solubility increases. In the case of a negative plate, the opposite takes place: The area on the film corresponding to the image on the plate is clear, while the non-image area is opaque. The coating beneath the clear film area is hardened due to the incident light, while the area not affected by the light is removed during developing. The light-hardened surface of a negative working plate is therefore oleophilic and accepts printing ink, while the non-image area that used to be coated with the coating removed by the developer is desensitized and therefore hydrophilic.

Photosensitive mixtures have been used for years in photopolymerizable compositions for the production of photosensitive materials such as e.g. printing plate precursors. However, an improved sensitivity in particular in the near UV and visible spectral ranges is required for new and advanced applications (e.g. exposure by means of lasers) so that the exposure time can be shortened. From an economic point of view it is also important that low-intensity lasers can be used, which are less expensive and more reliable than high-intensity lasers. Therefore, efforts have been made for some time to increase the sensitivity of photopolymerizable compositions.

Negative working systems containing 1,4-dihydropyridines are described in DD-A-287 796. The photopolymerizable compositions disclosed in this document comprise an onium compound as coinitiator. The sensitivity obtained with these systems cannot by far meet today's technical requirements.

DE-A1-37 10 281 describes photopolymerizable mixtures which in addition to a binder comprise an acrylic acid ester of a polyfunctional alcohol, which contains photooxidizable groups and one or more urethane groups, as well as an initiator system comprising a photoreducible dye, a trihalogenmethyl compound and an acridine or phenazine compound. However, the photosensitivity of this mixture does not meet current technical requirements. A similar mixture which, however, comprises an acrylic acid ester of a polyfunctional alcohol containing photooxidizable groups but no urethane groups is described in DE-37 43 455 A1. This mixture does not fulfill today's demands on photosensitivity, either.

The photopolymerizable mixture described in DE-38 24 903 A1 differs from the one described in DE-37 10 281 A1 in that the acrylic acid ester is characterized by the presence of both urea groups and urethane groups. However, its photosensitivity to irradiation with a wavelength in the range of 250 to 450 nm and its yellow light stability are insufficient.

DE-38 32 032 A1 describes a photopolymerizable mixture which in addition to a polymeric binder and a free-radical polymerizable compound comprises an initiator system comprising a photoreducible dye, a trihalogenmethyl compound and metallocene. This mixture does not meet today's photosensitivity requirements and furthermore exhibits an insufficient yellow light stability.

Document DE-40 08 815 A1 describes a photopolymerizable mixture comprising a polymeric binder, a free-radical polymerizable compound with at least one polymerizable group and at least one photooxidizable group and a metallocene compound as photoinitiator. However, its photosensitivity and yellow light stability do not meet current technical standards.

EP-1 079 276 A1 describes photopolymerizable mixtures comprising a combination of photoreducible dye and metallocene as initiator system and a mixture of a polymerizable compound with a photooxidizable group and a polyethylene glycol di(meth)acrylate with at least two ethylene glycol units as photopolymerizable component. In this case as well, improved photosensitivity and yellow light stability would be desirable.

DE-38 30 914 A1 describes photopolymerizable mixtures that are sensitive to irradiation with visible light at wavelengths above 450 nm. Acrylic acid esters of polyfunctional alcohols comprising a photooxidizable group and optionally a urethane group are used as polymerizable compounds.

It is the object of the present invention to provide negative working radiation-sensitive compositions which lead to radiation-sensitive elements exhibiting high photosensitivity in the range of 250 to 450 nm in combination with excellent yellow light stability and storage stability, and—in the case of printing plates—yielding a large number of copies on the press (i.e. low abrasion).

The object of the invention is achieved by a radiation-sensitive composition comprising (a) at least one photopolymerizable compound with at least one ethylenically unsaturated group accessible to a free-radical polymerization, wherein the at least one photopolymerizable compound has a molecular weight of 3,000 or less and can be obtained by reacting a diisocyanate with (i) an ethylenically unsaturated compound with a hydroxy group, and at the same time (ii) a saturated organic compound with an NH group and an OH group, wherein the reactants are used in amounts according to the following condition:

Number of moles of isocyanate groups ≦ number of moles of OH plus NH groups.

(b) at least one sensitizer which absorbs radiation from the wavelength range of 250 to 450 nm of the electromagnetic spectrum and is selected from:

(i) a 1,4-dihydropyridine derivative of formula (I)

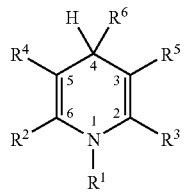
(I)

wherein
$R^1$ is selected from a hydrogen atom, —C(O)OR$^7$, an optionally substituted alkyl group, an optionally substituted aryl group and an optionally substituted aralkyl group,
$R^2$ and $R^3$ are independently selected from optionally substituted alkyl groups, optionally substituted aryl groups, CN and a hydrogen atom,
$R^4$ and $R^5$ are independently selected from —C(O)OR$^7$, —C(O)R$^7$, —C(O)NR$^8$R$^9$ and CN,
or $R^2$ and $R^4$ together form an optionally substituted phenyl ring or a 5- to 7-membered carbocyclic or heterocyclic ring, wherein the unit

is present in the carbocyclic or heterocyclic ring adjacent to position 5 of the 1,4-dihydropyridine ring and wherein the carbocyclic or heterocyclic ring optionally comprises additional substituents,
or both $R^2$ and $R^4$ as well as $R^3$ and $R^5$ form either optionally substituted phenyl rings or 5- to 7-membered carbocyclic or heterocyclic rings, wherein the unit

is present in the carbocyclic or heterocyclic rings adjacent to positions 3 and 5 of the dihydropyridine ring and wherein the carbocyclic or heterocyclic rings optionally comprise additional substituents,
or one of the pairs $R^2/R^4$ and $R^3/R^5$ forms a 5- to 7-membered carbocyclic or heterocyclic ring, wherein the unit

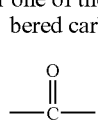

is present in the carbocyclic or heterocyclic ring adjacent to position 5 or 3 of the dihydropyridine ring and wherein the carbocyclic or heterocyclic ring optionally comprises additional substituents and the other pair forms an optionally substituted phenyl ring,
or $R^2$ and $R^1$ or $R^3$ and $R^1$ form a 5- to 7-membered heterocyclic ring which can optionally comprise one or more substituents and which, in addition to the nitrogen atom it shares with the 1,4-dihydropyridine ring, optionally comprises additional nitrogen atoms, —NR$^{13}$ groups, —S— or —O—, $R^{13}$ is selected from a hydrogen atom, an alkyl group, aryl group and aralkyl group, $R^6$ is selected from an alkyl group optionally substituted with a halogen atom or a —C(O) group, an optionally substituted aryl group, an optionally substituted aralkyl group, an optionally substituted heterocyclic group and the group

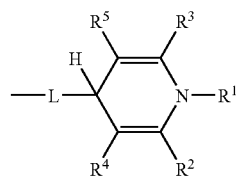

wherein
L is an alkylene or arylene group and $R^1$ to $R^5$ are as defined above for formula (I),
$R^7$ is a hydrogen atom, aryl group, aralkyl group or alkyl group, wherein the alkyl group and the alkyl unit of the aralkyl group optionally comprise one or more C—C double and/or C—C triple bonds, and
$R^8$ and $R^9$ are independently selected from a hydrogen atom, an optionally substituted alkyl group, an optionally substituted aryl group and an optionally substituted aralkyl group and (ii) an oxazole compound of formula (II)

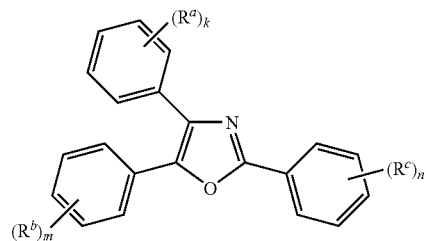
(II)

wherein each $R^a$, $R^b$ und $R^c$ is independently selected from a halogen atom, an optionally substituted alkyl group, an optionally substituted aryl group, which may also be fused, an optionally substituted aralkyl group, a group —NR'R" and a group —OR''',
wherein R' and R" are independently selected from a hydrogen atom, an alkyl, aryl or aralkyl group,
R''' is an optionally substituted alkyl, aryl or aralkyl group or a hydrogen atom and k, m and n are independently 0 or an integer from 1 to 5;

(c) at least one coinitiator capable of forming free radicals together with the sensitizer (b) and selected from 2,2',4,4',5,5'-hexaarylbiimidazoles, compounds with at least one photolytically cleavable trihalogenmethyl group, diaryliodonium salts, triarylsulfonium salts and N-heterocyclic compounds with at least one nitrogen atom in the ring, having an oxy substituent at least one ring nitrogen atom, and mixtures of the above compounds; and (d) optionally one or more components selected from alkali-soluble binders, colorants, exposure indicators, plasticizers, chain transfer agents, leuco dyes, surfactants, inorganic fillers and thermopolymerization inhibitors;

with the proviso that the radiation-sensitive composition does not comprise any metallocene.

Unless defined otherwise, the term "alkyl group" as used in the present invention refers to a straight-chain, branched or cyclic saturated hydrocarbon group which preferably comprises 1 to 18 carbon atoms, more preferred 1 to 10 carbon atoms and most preferred 1 to 6 carbon atoms. The alkyl group can optionally comprise one or more substituents (preferably 0 or 1 substituent), for example selected from halogen atoms (fluorine, chlorine, bromine, iodine), CN, $NR^{13}{}_2$, C(O)OR$^{13}$ and OR$^{13}$ (R$^{13}$ independently represents a hydrogen atom, an alkyl group, aryl group or aralkyl group). The above definition also applies to the alkyl unit of an aralkyl group and an alkylene group.

Unless defined otherwise, the term "aryl group" as used in the present invention refers to an aromatic carbocyclic group with one or more fused rings, which preferably comprises 6 to 14 carbon atoms. The aryl group can optionally comprise one or more substituents (preferably 0 to 3) selected for example from halogen atoms, alkyl groups, alkoxy groups, CN, $NR^{13}{}_2$, $SO_3H$, COOR$^{13}$ and OR$^{13}$ (wherein each R$^{13}$ is independently selected from hydrogen, alkyl, aryl and aralkyl). The above definition also applies to the aryl unit of an aralkyl group and an arylene group. Preferred examples include a phenyl group and a naphthyl group which can optionally be substituted.

A fused ring or ring system as referred to in the present invention is a ring that shares two atoms with the ring to which it is fused.

Unless defined otherwise, the term "heterocyclic group" as used in the present invention refers to a 5- to 7-membered (preferably 5- or 6-membered) saturated, unsaturated (non-aromatic) or aromatic ring, wherein one or more ring carbon atoms are replaced with heteroatoms selected from N, NR$^{13}$, S and O (preferably N or NR$^{13}$). The heterocyclic ring can optionally comprise one or more substituents, selected for example from alkyl groups, aryl groups, aralkyl groups, halogen atoms, —OR$^{13}$, —$NR^{13}{}_2$, —C(O)OR$^{13}$, C(O)$NR^{13}{}_2$ and CN (wherein each R$^{13}$ is independently selected from hydrogen, alkyl, aryl and aralkyl).

As referred to in the present invention, a carbocyclic ring is a 5- to 7-membered (preferably 5- or 6-membered) saturated or unsaturated ring. The carbocyclic ring can optionally comprise one or more substituents, selected for example from alkyl groups, aryl groups, aralkyl groups, halogen atoms, CN, —$NR^{13}{}_2$, —C(O)OR$^{13}$, —C(O)$NR^{13}{}_2$ and —OR$^{13}$ (wherein R$^{13}$ is as defined above).

The photopolymerizable compounds with a molecular weight of 3,000 or less used in the present invention are reaction products obtained by reacting a diisocyanate simultaneously with (i) an ethylenically unsaturated compound with a hydroxy group and (ii) a saturated organic compound with an NH group and an OH group, wherein the reactants are used in amounts according to the following condition:

Number of moles of isocyanate groups ≦ number of moles of OH plus NH groups.

Examples of diisocyanates are represented by the following formula:

$$O=C=N-(CR^{14}{}_2)_a-D-(CR^{14}{}_2)_b-N=C=O \quad (VI)$$

wherein a and b independently represent 0 or an integer from 1 to 3, each R$^{14}$ is independently selected from H and $C_1$-$C_3$ alkyl and D is a saturated or unsaturated spacer which can optionally comprise further substituents in addition to the two isocyanate groups. D can be a chain-shaped or a ring-shaped unit. As used in the present invention, the term "diisocyanate" refers to an organic compound comprising two isocyanate groups but no OH groups or secondary or primary amino groups.

R$^{14}$ is preferably H or CH$_3$.

a and b are preferably independently 0 or 1.

D can e.g. be an alkylene group $(CH_2)_w$, wherein w is an integer from 1 to 12, preferably 1 to 6, and wherein one or more hydrogen atoms are optionally replaced with substituents such as e.g. alkyl groups (preferably $C_1$-$C_6$), a cycloalkylene group, arylene group, saturated or unsaturated heterocyclic group.

Suitable diisocyanates are for example the following:
Trimethylhexamethylene diisocyanate
1,6-bis-[isocyanate]-hexane
5-isocyanate-3-(isocyanatomethyl)-1,1,3-trimethylcyclohexane
1,3-bis-[5-isocyanate-1,1,3-trimethyl-phenyl]-2,4-dioxo-1,3-diazetidine
3,6-bis-[9-isocyanatononyl]-4,5-di-(1-heptenyl)-cyclohexene
bis-[4-isocyanate-cyclohexyl]-methane
trans-1,4-bis-[isocyanate]-cyclohexane
1,3-bis-[isocyanatomethyl]-benzene
1,3-bis-[1-isocyanate-1-methyl-ethyl]-benzene
1,4-bis-[2-isocyanatoethyl]-cyclohexane
1,3-bis-[isocyanatomethyl]cyclohexane
1,4-bis-[1-isocyanate-1-methyl-ethyl]benzene
bis-[isocyanate]-isododecyl-benzene
1,4-bis-[isocyanate]-benzene
2,4-bis-[isocyanate]-toluene
2,6-bis-[isocyanate]-toluene
N,N'-bis-[3-isocyanate-4-methyl-phenyl]urea
1,3-bis-[3-isocyanate-4-methyl-phenyl]-2,4-dioxo-1,3-diazetidine
bis-[2-isocyanate-phenyl]-methane
(2-isocyanate-phenyl)-(4-isocyanate-phenyl)-methane
bis-[4-isocyanate-phenyl]-methane
1,5-bis-[isocyanate]-naphthalene
4,4'-bis-[isocyanate]-3,3'-dimethyl-biphenyl The ethylenically unsaturated compound (i), which comprises a hydroxy group, comprises at least one non-aromatic C—C double bond, which is preferably terminal. The hydroxy group is preferably not bonded to a doubly bonded carbon atom; the hydroxy group is not part of a carboxy group. In addition to the one OH group, the ethylenically unsaturated compound (i) does not comprise any further functional groups, such as e.g. NH, which can react with the isocyanate.

Examples of the ethylenically unsaturated compound (i) include

Hydroxy($C_1$-$C_{12}$)alkyl(meth)acrylates (e.g. 2-hydroxyethyl(meth)acrylate, 2- or 3-hydroxypropyl(meth)acrylate, 2-, 3- or 4-hydroxybutyl(meth)acrylate), hydroxy($C_1$-$C_{12}$)alkyl(meth)acrylamides (e.g. 2-hydroxyethyl(meth)acrylamide, 2- or 3-hydroxy-propyl(meth)acrylamide, 2-, 3- or 4-hydroxybutyl(meth)acrylamide), mono(meth)-acrylates of oligomeric or polymeric ethylene glycols or propylene glycols (e.g. polyethylene glycol mono(meth)acrylate, triethylene glycol mono(meth)acrylate), allyl alcohol, pentaerythritol tri(meth)acrylate, 4-hydroxy($C_1$-$C_{12}$)alkylstyrene (e.g. 4-hydroxymethylstyrene), 4-hydroxystyrene, hydroxycyclohexyl(meth)acrylate.

The term "(meth)acrylate" etc. as used in the present invention indicates that both methacrylate and acrylate etc. are meant.

The saturated organic compound (ii) is a compound with an OH and an NH group.

The saturated organic compound (ii) can for example be represented by the following formula (VII) or (VIII)

$$R^{15}-\underset{H}{N}-E-OH \quad (VII)$$

$$\underset{H}{\underset{|}{N}}\!\!\!\diagup\!\!\!(R^{16})_z \quad (VIII)$$

wherein $R^{15}$ is a straight-chain (preferably $C_1$-$C_{12}$, especially preferred $C_1$-$C_4$), branched (preferably $C_3$-$C_{12}$, especially preferred $C_3$-$C_6$) or cyclic (preferably $C_3$-$C_8$, especially preferred $C_5$-$C_6$) alkyl group, E is a straight-chain (preferably $C_1$-$C_6$, especially preferred $C_1$-$C_2$), branched (preferably $C_3$-$C_{12}$, especially preferred $C_3$-$C_6$) or cyclic (preferably $C_3$-$C_8$, especially preferred $C_5$-$C_6$) alkylene group, $$\bigcirc_N$$

represents a saturated heterocyclic ring with 5 to 7 ring atoms, which in addition to the nitrogen atom shown above optionally comprises an additional heteroatom selected from S, O and $NR^{17}$, wherein $R^{17}$ is an alkyl group optionally substituted with an OH group, $R^{16}$ is OH or a straight-chain, branched or cyclic alkyl group substituted with an OH group, and z=0 if the heterocyclic ring comprises $NR^{17}$ and $R^{17}$ is an alkyl group substituted with OH and z=1 if the saturated heterocyclic ring does not comprise $NR^{17}$ or if the saturated heterocyclic ring comprises $NR^{17}$ and $R^{17}$ is an unsubstituted alkyl group.

Of the compounds of formula (VII), those are preferred wherein E represents —$CH_2CH_2$— and $R^{15}$ is a straight-chain $C_1$-$C_{12}$ (preferably $C_1$-$C_4$) alkyl group.

Of the compounds of formula (VIII), those are preferred wherein either no additional heteroatom is present in the ring and $R^{16}$ is an alkyl group substituted with OH (i.e. hydroxyalkyl-substituted piperidines), or $NR^{17}$ is present in the ring and $R^{17}$ is an alkyl group substituted with OH (i.e. N-hydroxyalkyl-substituted piperazines).

In particular, the following compounds should be mentioned as compound (ii):

2- or 3-(2-hydroxyethyl)piperidine,
2- or 3-hydroxymethylpiperidine,
N-(2-hydroxyethyl)piperazine and
N-(2-hydroxymethyl)piperazine.

The number of moles of isocyanate groups must not exceed the number of moles of OH groups and NH groups combined since the product should not comprise any more free isocyanate groups.

The reaction of the diisocyanate and the ethylenically unsaturated compound (i) and the saturated compound (ii) usually takes place in an aprotic solvent such as a ketone (e.g. acetone, methyl ethyl ketone, diethyl ketone, cyclopentanone and cyclohexanone), an ether (e.g. diethyl ether, diisopropyl ether, tetrahydrofuran, dioxane and 1,2-dioxolane) and an ester (e.g. ethyl acetate, methyl acetate, butyl acetate, ethylene glycol diacetate, methyl lactate and ethyl lactate) or in a technical solvent such as ethylene glycol monomethyl ether acetate, propylene glycol monomethyl ether acetate etc.

It is preferred to use a catalyst for condensation reactions. All known catalysts suitable for condensation reactions can be used. Examples include tertiary amines, such as triethylamine, pyridine etc. and tin compounds, such as dibutyltin dilaurate.

The reaction preferably takes place at 10 to 120° C., especially preferred at 30 to 70° C.

Under optimized synthesis conditions a uniform product can be obtained. However, as a rule it has to be assumed that a mixed product is formed. The molecular weight of the product should be 3,000 or less. In the case of a mixed product, the molecular weight is the weight-average molecular weight. Whenever a photopolymerizable compound (a) is mentioned in the present invention, this term refers both to a uniform reaction product and a mixed product.

The amount of photopolymerizable compound (a) in the radiation-sensitive composition is not particularly restricted; however, it is preferably 5 to 95 wt.-%, especially preferred 20 to 85 wt.-%, based on the total solids content of the composition.

A sensitizer as referred to in the present invention is a compound which can absorb radiation of a wavelength in the range of 250 to 450 nm, preferably 350 to 450 nm, when it is exposed but which cannot by itself, i.e. without the addition of coinitiators, form free radicals. Sensitizers used in the present invention have to be capable of interacting with the coinitiators used in the present invention.

One sensitizer or a mixture of two or more can be used in the present invention.

According to the present invention, the sensitizer is selected from
(i) 1,4-dihydropyridine compounds of formula (I) and
(ii) oxazole compounds of formula (II)

and mixtures thereof.

According to one embodiment, a 1,4-dihydropyridine compound of formula (I) is used as sensitizer (I)

wherein
$R^1$ is selected from a hydrogen atom, —$C(O)OR^7$, an optionally substituted alkyl group, an optionally substituted aryl group and an optionally substituted aralkyl group, $R^2$ and $R^3$ are independently selected from optionally substituted alkyl groups, optionally substituted aryl groups, CN and a hydrogen atom, $R^4$ and $R^5$ are independently selected from —$C(O)OR^7$, —$C(O)R^7$, —$C(O)NR^8R^9$ and CN, or $R^2$ and $R^4$ together form an optionally substituted phenyl ring or a 5- to 7-membered carbocyclic or heterocyclic ring, wherein the unit

is present in the carbocyclic or heterocyclic ring adjacent to position 5 of the dihydropyridine ring and wherein the carbocyclic or heterocyclic ring optionally comprises additional substituents, or both $R^2$ and $R^4$ as well as $R^3$ and $R^5$ form either optionally substituted phenyl rings or 5- to 7-membered carbocyclic or heterocyclic rings, wherein the unit

is present in the carbocyclic or heterocyclic rings adjacent to positions 3 and 5 of the dihydropyridine ring and wherein the carbocyclic or heterocyclic rings optionally comprise additional substituents, or one of the pairs $R^2/R^4$ and $R^3/R^5$ forms a 5- to 7-membered carbocyclic or heterocyclic ring, wherein the unit

is present in the carbocyclic or heterocyclic ring adjacent to position 5 or 3 of the dihydropyridine ring and wherein the carbocyclic or heterocyclic ring optionally comprises additional substituents and the other pair forms an optionally substituted phenyl ring, or $R^2$ and $R^1$ or $R^3$ and $R^1$ form a 5- to 7-membered heterocyclic ring which can optionally comprise one or more substituents and which, in addition to the nitrogen atom it shares with the 1,4-dihydropyridine ring, optionally comprises additional nitrogen atoms, —$NR^{13}$ groups, —S— or —O—, $R^{13}$ is selected from a hydrogen atom, an alkyl group, aryl group and aralkyl group, $R^6$ is selected from an alkyl group optionally substituted with a halogen atom or a —C(O) group, an optionally substituted aryl group, an optionally substituted aralkyl group, an optionally substituted heterocyclic group and the group

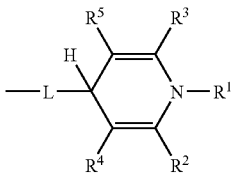

wherein

L is an alkylene group or an arylene group, and $R^1$ to $R^5$ are as defined above for formula (I), $R^7$ is a hydrogen atom, aryl group, aralkyl group or alkyl group, wherein the alkyl group and the alkyl unit of the aralkyl group optionally comprise one or more C—C double and/or C—C triple bonds, and and $R^8$ and $R^9$ are independently selected from a hydrogen atom, an optionally substituted alkyl group, an optionally substituted aryl group and an optionally substituted aralkyl group.

According to a preferred embodiment, $R^1$ is a hydrogen atom.

If $R^2$ and $R^3$ do not form rings with adjacent substituents, they are preferably independently selected from $C_1$-$C_5$ alkyl groups or aryl groups.

If $R^4$ and $R^5$ do not form rings with adjacent substituents, they are preferably independently selected from —C(O)OR$^7$.

$R^6$ is preferably selected from $C_1$-$C_5$ alkyl groups or aryl groups.

$R^7$ is preferably selected from $C_1$-$C_5$ alkyl groups and it is especially preferred that it represents a methyl group.

According to one embodiment, the substitution of the 1,4-dihydropyridine ring with $R^2/R^4$ and $R^3/R^5$ is symmetrical, i.e. $R^2=R^3$ and $R^4=R^5$.

According to a preferred embodiment, $R^2$ and $R^3$ are independently selected from optionally substituted alkyl groups, optionally substituted aryl groups, CN and a hydrogen atom, and $R^4$ and $R^5$ are independently selected from —C(O)OR$^7$, —C(O)R$^7$, —C(O)NR$^8$R$^9$ and CN.

Further suitable sensitizers are 1,4-dihydropyridine derivatives of formula (Ia)

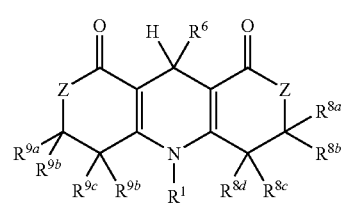

(Ia)

wherein $R^1$ and $R^5$ are as defined above, the groups $R^{8a}$ to $R^{8d}$ and $R^{9a}$ to $R^{9d}$ are independently selected from a hydrogen atom, alkyl groups and aryl groups, wherein two groups $R^9$ or $R^3$ of adjacent ring carbon atoms can also form a saturated or unsaturated carbocyclic or heterocyclic ring or fused aromatic ring together, each Z is independently selected from $CR^{13}{}_2$, O, S and $NR^3$ and each $R^{13}$ independently represents a hydrogen atom, alkyl, aralkyl or aryl group, of formula (Ib)

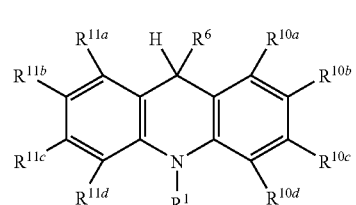

(Ib)

wherein $R^1$ and $R^6$ are as defined above, and $R^{10a}$ to $R^{10d}$ and $R^{11a}$ to $R^{11d}$ are independently selected from a hydrogen atom, alkyl groups, aryl groups, aralkyl groups, halogen atoms (fluorine, chlorine, bromine, iodine), CN, $NR^{13}{}_2$, C(O)OR$^{13}$ and OR$^{13}$ (each $R^{13}$ independently represents a hydrogen atom, an alkyl group, aryl group or aralkyl group), wherein two groups $R^{11}$ or $R^{10}$ of adjacent ring carbon atoms can also form an unsaturated carbocyclic or heterocyclic ring or fused aromatic ring together, of formula (Ic)

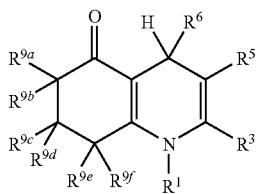

(Ic)

wherein $R^1$, $R^3$, $R^5$ and $R^6$ are as defined above and the groups $R^{9a}$ to $R^{9f}$ are independently selected from a hydrogen atom, alkyl groups, aryl groups, aralkyl groups, halogen atoms (fluorine, chlorine, bromine, iodine), CN, $NR^{13}_2$, $C(O)OR^{13}$ and $OR^{13}$ ($R^{13}$ independently represents a hydrogen atom, an alkyl group, aryl group or aralkyl group), wherein two groups $R^9$ of adjacent ring carbon atoms can also form a saturated or unsaturated carbocyclic or heterocyclic ring or fused aromatic ring together, of formula (Id)

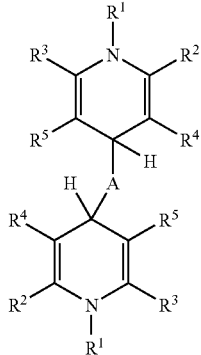

(Id)

wherein each $R^1$, $R^2$, $R^3$, $R^4$ and $R^5$ independently is as defined above and A is selected from alkylene and arylene, of formula (Ie)

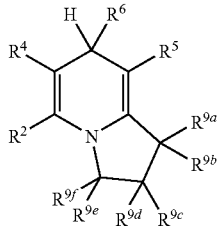

(Ie)

wherein $R^2$, $R^4$, $R^5$ and $R^6$ are as defined above and groups $R^{9a}$ to $R^{9f}$ are defined as are groups $R^{9a}$ to $R^{9d}$ of formula (Ia) above, of formula (If)

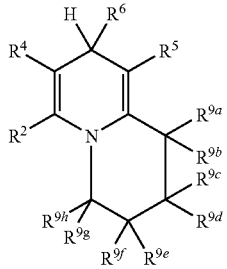

(If)

wherein $R^2$, $R^4$, $R^5$ and $R^6$ are as defined above and groups $R^{9a}$ to $R^{9h}$ are defined as are groups $R^{9a}$ to $R^{9d}$ of formula (Ia) above, and of formula (Ig)

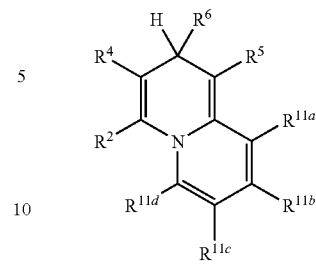

(Ig)

wherein $R^2$, $R^4$, $R^5$ and $R^6$ are as defined above and the groups $R^{11a}$ to $R^{11d}$ are independently selected from a hydrogen atom, alkyl groups, aryl groups, aralkyl groups, halogen atoms (fluorine, chlorine, bromine, iodine), CN, $NR^{13}_2$, $COOR^{13}$ and $OR^{13}$ ($R^{13}$ independently represents a hydrogen atom, an alkyl group, aryl group or aralkyl group), wherein two adjacent groups of groups $R^{11a}$ to $R^{11d}$ of adjacent ring carbon atoms can also form an unsaturated carbocyclic or heterocyclic ring or fused aromatic ring together.

It goes without saying that the number of groups $R^8$ or $R^9$ in formulas (Ia), (Ic), (Ie) and (If) is reduced if two groups $R^8$ or $R^9$ of adjacent ring carbon atoms together form a fused aromatic ring.

In the 1,4-dihydropyridine derivatives of formula (Ia), $R^1$ is preferably a hydrogen atom, $R^6$ is a methyl or phenyl group and Z is preferably O or $CH_2$; the substituents $R^{8a}$ to $R^{8d}$ and $R^{9a}$ to $R^{9d}$ are independently preferably selected from hydrogen atoms and methyl groups. Of the derivatives of formula (Ia) those with symmetrical substitution at the dihydropyridine ring are especially preferred.

In the derivatives of formula (Ib), $R^1$ is preferably a hydrogen atom and $R^6$ is preferably a methyl or phenyl group. The substituents $R^{10a}$ to $R^{10d}$ and $R^{11a}$ to $R^{11d}$ are independently preferably selected from $C_1$-$C_5$ alkyl groups, $OR^{13}$ and halogen atoms; a symmetrical substitution of the two aromatic rings is especially preferred.

In the 1,4-dihydropyridine derivatives of formula (Ic), $R^1$ is preferably a hydrogen atom, $R^6$ is preferably a methyl or phenyl group, $R^3$ is preferably a methyl group and $R^5$ is preferably $C(O)OR^7$ (wherein $R^7$ is as defined above). The substituents $R^{9a}$ to $R^{9f}$ are independently preferably selected from $C_1$-$C_5$ alkyl groups. A methyl group is especially preferred.

In the derivatives of formula (Id), A is preferably a 1,4-phenylene or 1,2-ethylene group. Furthermore, it is preferred that both groups $R^1$ be the same, both groups $R^2$ be the same, both groups $R^3$ be the same, both groups $R^4$ be the same and both groups $R^5$ be the same; the preferred definitions given with respect to formula (I) apply to all groups $R^1$ to $R^5$.

In the derivatives of formula (Ie), $R^2$ is preferably $C_1$-$C_5$ alkyl, $R^4$ is preferably —$C(O)OR^7$, $R^5$ is preferably $C(O)OR^7$ and $R^6$ is preferably $C_1$-$C_5$ alkyl or phenyl groups ($R^7$ is as defined above). The substituents $R^{9a}$ to $R^{9f}$ are preferably independently selected from $C_1$-$C_5$ alkyl groups.

In the derivatives of formula (If), $R^2$ is preferably $C_1$-$C_5$ alkyl, $R^4$ is preferably $C(O)OR^7$, $R^5$ is preferably $C(O)OR^7$ and $R^6$ is preferably a $C_1$-$C_5$ alkyl or a phenyl group (wherein $R^7$ is as defined above). The substituents $R^{9a}$ to $R^{9h}$ are preferably independently selected from $C_1$-$C_5$ alkyl groups.

In the derivatives of formula (Ig), $R^2$ is preferably $C_1$-$C_5$ alkyl, $R^4$ is preferably $C(O)OR^7$, $R^5$ is preferably $C(O)OR^7$ and R⁶ is preferably a $C_1$-$C_5$ alkyl or a phenyl group. The substituents $R^{11}$ are preferably independently selected from $C_1$-$C_5$ alkyl groups.

Of the 1,4-dihydropyridine derivatives of formulas (Ia) to (Ig) those of formulas (Ia) and (Id) are especially preferred.

The 1,4-dihydropyridine derivatives used in the present invention can be prepared according to processes well known to the person skilled in the art, such as the Hantzsch synthesis. As an example, reference is made to J. Org. Chem. 30 (1965), p. 1914 et seqq., and *Angew. Chem.* [Applied Chemistry] (Intern.) 20 (1981), p. 762 et seqq.; the processes described therein can also be used for the synthesis of 1,4-dihydropyridines not explicitly disclosed therein by varying the starting compounds accordingly.

According to another embodiment, an oxazole compound of formula (II) is used as sensitizer:

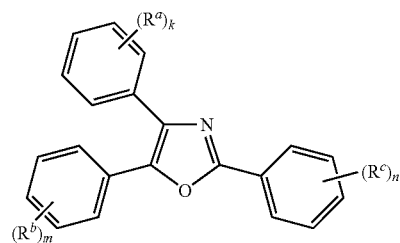

(II)

wherein each $R^a$, $R^b$ und $R^c$ is independently selected from a halogen atom, an optionally substituted alkyl group, an optionally substituted aryl group, which may also be fused, an optionally substituted aralkyl group, a group —NR'R" and a group —OR''',
wherein R' and R" are independently selected from a hydrogen atom, an alkyl, aryl or aralkyl group,
R''' is an optionally substituted alkyl, aryl or aralkyl group or a hydrogen atom, and
k, m and n are independently 0 or an integer from 1 to 5.

Preferably, $R^a$, $R^b$ and $R^c$ are independently selected from a halogen atom, a $C_1$-$C_8$ alkyl group and a group —NR'R", wherein R' and R" are preferably independently selected from hydrogen atoms and $C_1$-$C_6$ alkyl groups.

k, m and n are preferably independently 0 or 1.

Oxazole derivatives of formula (II) wherein at least one of $R^a$, $R^b$ and $R^c$ represents a group —NR'R" wherein R' and R" are preferably independently selected from hydrogen atoms and $C_1$-$C_6$ alkyl, and especially preferred R'=R"=$C_1$-$C_6$ alkyl, are especially preferred.

The oxazole derivatives of formula (II) used in the present invention can be prepared according to processes well known to the person skilled in the art. In this connection, reference is made to DE-A-1120875 and EP-A-129 059; the processes described in these documents can also be used for the synthesis of oxazoles not explicitly described therein by varying the starting compounds accordingly.

The amount of sensitizer(s) is not particularly restricted; however, it is preferably in the range of 0.2 to 25 wt.-%, based on the solids content or the dry layer weight of a coating produced from the composition, especially preferred 0.5 to 15 wt.-%.

A coinitiator as referred to in the present invention is a compound that does not essentially absorb when exposed with UV radiation or visible light but forms free radicals together with the sensitizers used according to the present invention. According to the present invention, the coinitiators are selected from 2,2', 4,4',5,5'-hexaarylbiimidazoles (in the following briefly referred to as hexaarylbiimidazoles), compounds with at least one trihalogenmethyl group, diaryliodonium salts, triarylsulfonium salts and N-heterocyclic compounds with at least one nitrogen atom in the ring, comprising an oxy substituent at least one ring nitrogen atom. Metallocenes cannot be used as coinitiators, not even if a coinitiator from the above list is used at the same time, since it was found that they affect yellow light stability.

Hexaarylbiimidazoles and trihalogenmethyl-substituted compounds are preferred coinitiators. Suitable hexaarylbiimidazoles are for example represented by the following formula (V):

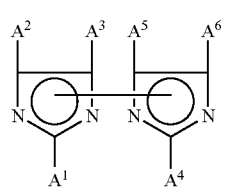

(V)

wherein $A^1$-$A^6$ are substituted or unsubstituted $C_5$-$C_{20}$ aryl groups which are identical or different from each other and in whose rings one or more carbon atoms can optionally be substituted by heteroatoms selected from O, N and S. Suitable substituents for the aryl groups are those that do not inhibit the light-induced dissociation to triarylimidazolyl radicals, e.g. halogen atoms (fluorine, chlorine, bromine, iodine), —CN, $C_1$-$C_6$ alkyl (optionally with one or more substituents selected from halogen atoms, —CN and —OH), $C_1$-$C_6$ alkoxy, $C_6$ alkylthio, ($C_1$-$C_6$ alkyl) sulfonyl.

With respect to formula (V), preferred aryl groups are substituted and unsubstituted phenyl, biphenyl, naphthyl, pyridyl, furyl and thienyl groups. Especially preferred are substituted and unsubstituted phenyl groups, and particularly preferred are halogen-substituted phenyl groups.

Examples of suitable hexyarylbiimidazoles include:
2,2'-Bis(bromophenyl)-4,4',5,5'-tetraphenylbiimidazole,
2,2'-bis(p-carboxyphenyl)-4,4',5,5"-tetraphenylbiimidazole,
2,2'-bis(o-chlorophenyl)-4,4',5,5'-tetrakis(p-methoxyphenyl)-biimidazole,
2,2'-bis(p-chlorophenyl)-4,4',5,5'-tetrakis(p-methoxyphenyl)-biimidazole,
2,2'-bis(p-cyanophenyl)-4,4',5,5'-tetrakis(p-methoxyphenyl)-biimidazole,
2,2'-bis(2,4-dichlorophenyl)-4,4',5,5'-tetraphenylbiimidazole,
2,2'-bis(2,4-dimethoxyphenyl)-4,4',5,5'-tetraphenylbiimidazole,
2,2'-bis(o-ethoxyphenyl)-4,4',5,5'-tetraphenylbiimidazole,
2,2'-bis(m-fluorophenyl)-4,4',5,5'-tetraphenylbiimidazole,
2,2'-bis(o-fluorophenyl)-4,4',5,5'-tetraphenylbiimidazole,
2,2'-bis(p-fluorophenyl)-4,4',5,5'-tetraphenylbiimidazole,
2,2'-bis(o-hexoxyphenyl)-4,4',5,5'-tetraphenylbiimidazole,
2,2'-bis(o-hexylphenyl)-4,4',5,5'-tetrakis(p-methoxyphenyl)-biimidazole,
2,2'-bis(3,4-methylenedioxyphenyl)-4,4',5,5'-tetraphenylbiimidazole,
2,2'-bis(o-chlorophenyl)-4,4',5,5'-tetrakis(m-methoxyphenyl)biimidazole,
2,2'-bis(o-chlorophenyl)-4,4',5,5'-tetrakis[m-(betaphenoxyethoxyphenyl)]biimidazole,
2,2'-bis(2,6-dichlorophenyl)-4,4',5,5'-tetraphenylbiimidazole,
2,2'-bis(o-methoxyphenyl)-4,4',5,5'-tetraphenylbiimidazole,
2,2'-bis(p-methoxyphenyl)-4,4'-bis(o-methoxyphenyl)-5,5'-diphenylbiimidazole, 2,2'-bis(o-nitrophenyl)-4,4',5,5'-tetraphenylbiimidazole,
2,2'-bis(p-phenylsulfonylphenyl)-4,4',5,5'-tetraphenyl-biimidazole,
2,2'-bis(p-sulfamoylphenyl)-4,4',5,5'-tetraphenylbiimidazole,
2,2'-bis(2,4,5-trimethylphenyl)-4,4',5,5'-tetraphenylbiimidazole,
2,2'-di-4-biphenylyl-4,4',5,5'-tetraphenylbiimidazole,
2,2'-di-1-naphthyl-4,4',5,5'-tetrakis(p-methoxyphenyl)-biimidazole,
2,2'-di-9-phenanthryl-4,4',5,5'-tetrakis(p-methoxyphenyl)-biimidazole,
2,2'-diphenyl-4,4',5,5'-tetra-4-biphenylylbiimidazole,
2,2'-diphenyl-4,4',5,5'-tetra-2,4-xylylbiimidazole,
2,2'-di-3-pyridyl-4,4',5,5'-tetraphenylbiimidazole,
2,2'-di-3-thienyl-4,4',5,5'-tetraphenylbiimidazole,
2,2'-di-o-tolyl-4,4',5,5'-tetraphenylbiimidazole,
2,2'-di-p-tolyl-4,4'-di-o-tolyl-5,5'-diphenylbiimidazole,
2,2'-di-2,4-xylyl-4,4',5,5'-tetraphenylbiimidazole,
2,2',4,4',5,5'-hexakis(p-benzylthiophenyl)biimidazole,
2,2',4,4',5,5'-hexa-1-naphthylbiimidazole,
2,2',4,4',5,5'-hexaphenylbiimidazole,
2,2'-bis(2-nitro-5-methoxyphenyl)-4,4',5,5'-tetraphenylbiimidazole,
2,2'-bis(o-nitrophenyl)-4,4',5,5'-tetrakis(m-methoxyphenyl)biimidazole,
2,2'-bis(2-chloro-5-sulfophenyl)-4,4',5,5'-tetraphenylbiimidazole,
2,2',5-tris(2-chlorophenyl)-4-(3,4-dimethoxyphenyl)-4,5'diphenylbiimidazole,
2,2'-bis(o-chlorophenyl)-4,4',5,5'-tetraphenylbiimidazole,
2,2'-bis(o-chlorophenyl)-4,4',5,5'-tetra(p-fluorophenyl)biimidazole,
2,2'-bis(o-bromophenyl)-4,4',5,5'-tetra(p-iodophenyl)biimidazole,
2,2'-bis(o-chlorophenyl)-4,4',5,5'-tetra(p-chloronaphthyl)biimidazole,
2,2'-bis(o-chlorophenyl)-4,4',5,5'-tetra(p-chlorophenyl)biimidazole,
2,2'-bis(o-bromophenyl)-4,4',5,5'-tetra(p-chloro-p-methoxyphenyl)biimidazole,
2,2'-bis(o-chlorophenyl)-4,4',5,5'-tetra(o,p-dichlorophenyl)biimidazole,
2,2'-bis(o-chlorophenyl)-4,4',5,5'-tetra(o,p-dibromophenyl)biimidazole,
2,2'-bis(o-bromophenyl)-4,4',5,5'-tetra(o,p-dichlorophenyl)biimidazole or
2,2'-bis(o,p-dichlorophenyl)-4,4',5,5',-tetra(o,p-dichlorophenyl)biimidazole;
2,2'-bis(o-chlorophenyl)-4,4',5,5'-tetrakis(m-methoxyphenyl)biimidazole and
2,2'-bis(o-chlorophenyl)-4,4',5,5'-tetraphenylbiimidazole are especially preferred;

however, the invention is not restricted to those compounds.

Suitable hexyarylbiimidazoles are for example described in U.S. Pat. No. 4,565,769 and U.S. Pat. No. 3,445,232 and can be prepared according to known methods, such as e.g. the oxidative dimerization of triarylimidazoles.

Another group of coinitiators that can be used in the present invention are compounds with photolytically cleavable trihalogenmethyl groups. Bromine and chlorine are preferred as halogens, with chlorine being especially preferred. Preferably, the trihalogenmethyl groups are bonded to an aromatic carbo- or heterocyclic ring either directly of via a conjugated chain. In particular, trihalogenmethyl-substituted triazines, sulfones or ketones should be mentioned, especially those comprising 1 to 3 of such substituents. Examples include the following:
2-(4-Methoxyphenyl)-4,6-bis(trichloromethyl)-s-triazine,
2-(4-chlorophenyl)-4,6-bis(trichloromethyl)-s-triazine,
2-phenyl-4,6-bis(trichloromethyl)-s-triazine,
2,4,6-tri-(trichloromethyl)-s-triazine,
2,4,6-tri-(tribromomethyl)-s-triazine, tribromomethylphenylsulfone,
2-methyl-4,6-bis(trichloromethyl)-s-triazine,
2-styryl-4,6-bis(trichloromethyl)-s-triazine,
2-(p-methoxystyryl)-4,6-bis(trichloromethyl)-s-triazine,
2-(4-methoxynaphtho-1-yl)-4,6-bis(trichloromethyl)-s-triazine,
2-(4-ethoxynaphtho-1-yl)-4,6-bis(trichloromethyl)-s-triazine,
2-[4-(2-ethoxyethyl)-naphtho-1-yl]-4,6-bis(trichloromethyl)-s-triazine,
trichloromethylphenylsulfone,
trichloromethylphenylketone,
tribromomethylphenylketone.

Furthermore, diaryliodonium salts and triarylsulfonium salts can be used as coinitiators.

The selection of the counterion of the onium salt is not particularly critical, suitable counterions include e.g. chloride, bromide, p-toluene sulfonate, mesitylene sulfonate, hexafluorophosphate, tetrafluoroborate, hexafluoroarsenate and hexafluoroantimonate.

Examples of specific onium salts include: Diphenyliodonium chloride, 4,4'-dicumyliodonium chloride, 4,4'-bis-dodecylphenyliodonium hexafluorophosphate and bis-[4-diphenylsulfoniumphenyl]sulfide-bis-hexafluorophosphate.

Another group of coinitiators that can be used in the present invention are N-heterocyclic compounds with at least one N-oxy substituent, such as e.g. N-alkoxy-pyridinium salts, N-alkoxy-picolinium salts and N-alkoxy-4-phenyl-pyridinium salts; regarding the counterions in these salts, the remarks made above apply here as well.

One coinitiator or a mixture of coinitiators can be used in the present invention.

The amount of coinitiator(s) is not particularly restricted; however, it is preferably in the range of 0.2 to 25 wt.-%, based on the dry layer weight, especially preferred 0.5 to 15 wt.-%.

According to a preferred embodiment, the radiation-sensitive composition furthermore comprises a free-radical polymerizable component with at least one ethylenically unsaturated free-radical polymerizable group and at least one P—OH group (in the following also referred to as "P—OH monomer" in short). Preferably, this component is represented by the following formula (III) or (IV):

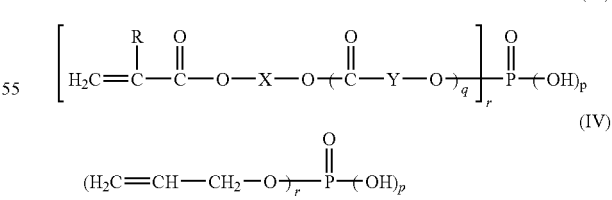

wherein r is 1 or 2, q is 0 or 1, p is 1 or 2, r+p=3, R represents $C_1$-$C_{12}$ alkyl (preferably $C_1$-$C_4$ alkyl, especially preferred methyl), X represents $C_2$-$C_{12}$ alkylene (preferably $C_2$-$C_4$ alkylene, especially preferred —$CH_2CH_2$—) and Y is $C_2$-$C_{12}$ alkylene (preferably $C_2$-$C_8$ alkylene, especially preferred —$(CH_2)_5$—).

Suitable P—OH monomers are also described in the prior art, e.g. in U.S. Pat. No. 3,686,371. The P—OH monomers of formula (III) can for example be prepared by esterification of phosphoric acid with an appropriate amount of (meth)acrylate comprising hydroxy groups. Hydroxyalkyl(meth)acrylates are especially preferred for this purpose.

In addition to the (meth)acrylic acid derivatives of formula (III), allyl phosphates of formula (IV), as described e.g. in U.S. Pat. No. 3,686,371, can also be used.

One kind of P—OH monomer or a mixture of different kinds can be used. The amount of P—OH monomer is not particularly restricted; however, it is preferably 0 to 30 wt.-%, based on the dry layer weight, especially preferred 0.2 to 20 wt.-% and particularly preferred 0.5 to 15 wt.-%.

By using one or more of the P—OH monomers as defined above, the required developing time can be shortened, which is an additional advantage for the consumer.

Optionally, the radiation-sensitive coating of the present invention can also comprise an alkali-soluble binder or a mixture of binders. The binder is preferably selected from polyvinyl acetals, acrylic polymers, polyurethanes and copolymers thereof. It is preferred that the binder contain acid groups, especially preferred carboxyl groups. Most preferred are acrylic polymers. Binders with acid groups preferably have acid numbers in the range of 10 to 250 mg KOH/g polymer. Optionally, the binder can comprise groups capable of undergoing a cycloaddition reaction (e.g. a 2+2 photocycloaddition). The amount of binder is not particularly restricted and is preferably in the range of 0 to 90 wt.-%, especially preferred 5 to 60 wt.-%.

In addition to the monomers used in the present invention, ethylenically unsaturated monomers that are free-radical polymerizable and comprise at least one C—C-double bond but no functional groups containing N, can optionally be used as well. Examples include esters of acrylic and methacrylic acids, itaconic acid, crotonic acid, isocrotonic acid, maleic acid and fumaric acid with one or more unsaturated groups. They may be present in solid or liquid form, with solid and highly viscous forms being preferred. In particular, the following compounds should be mentioned: Trimethylol propane triacrylate and -methacrylate, pentaerythritol triacrylate and -methacrylate, dipentaerythritol monohydroxy pentaacrylate and -methacrylate, dipentaerythritol hexaacrylate and -methacrylate, pentaerythritol tetraacrylate and -methacrylate, di(trimethylol propane)tetraacrylate and methacrylate, diethylene glycol diacrylate and -methacrylate, triethylene glycol diacrylate and -methacrylate or tetraethylene glycol diacrylate and -methacrylate.

The optional free-radical polymerizable monomers are preferably present in an amount of 0 to 45 wt.-%, based on the dry layer weight of a radiation-sensitive coating prepared from the radiation-sensitive composition of the present invention.

The radiation-sensitive coating can optionally also comprise small amounts of a thermopolymerization inhibitor which prevents the undesired thermopolymerization of monomers with ethylenically unsaturated free-radical polymerizable groups during the production and storage of the radiation-sensitive composition. Suitable examples of inhibitors of undesired thermopolymerization include hydroquinone, p-methoxyphenol, di-t-butyl-p-cresol, pyrrogallol, t-butylcatechol, benzoquinone, 4,4'-thio-bis-(3-methyl-6-t-butylphenol), 2,2'-methylene-bis-(4-methyl-6-t-butylphenol) and N-nitrosophenyl-hydroxylamine salts. The amount of polymerization inhibitor in the radiation-sensitive coating is preferably 0 to 5 wt.-%, based on the dry layer weight, especially preferred 0.01 to 2 wt.-%.

Furthermore, the radiation-sensitive coating of the present invention can comprise dyes or pigments for coloring the layer. It goes without saying that the colorant has to be selected such that it does not interfere with the sensitizer/coinitiator system. Examples of colorants include e.g. ethyl violet, crystal violet, phthalocyanine pigments, azo pigments, carbon black, titanium dioxide, azo dyes, triarylmethane dyes, anthraquinone dyes and cyanine dyes. The use of pigments is preferred. The amount of colorant is preferably 0 to 20 wt.-%, based on the dry layer weight, especially preferred 0.5 to 10 wt.-%.

For improving the physical properties of the hardened layer, the radiation-sensitive coating can additionally comprise further additives such as plasticizers. Suitable plasticizers include e.g. dibutyl phthalate, dioctyl phthalate, didodecyl phthalate, dioctyl adipate, dibutyl sebacate, triacetyl glycerin und tricresyl phosphate. The amount of plasticizer is not particularly restricted; however, it is preferably 0 to 10 wt.-%, based on the dry layer weight, especially preferred 0.25 to 5 wt.-%.

The radiation-sensitive composition can furthermore comprise known chain transfer agents such as e.g. mercaptobenzimidazole, 2-mercaptobenzimidazole, 2-mercaptobenzthiazole, 2-mercaptobenzoxazole and 3-mercaptotriazole. They are preferably used in an amount of 0 to 15 wt.-%, based on the dry layer weight, especially preferred 0.5 to 5 wt.-%.

Furthermore, the radiation-sensitive coating can comprise leuco dyes such as e.g. leuco crystal violet and leucomalachite green. They are preferably present in an amount of 0 to 10 wt.-%, based on the dry layer weight, especially preferred 0.5 to 5 wt.-%.

Additionally, the radiation-sensitive coating can comprise surfactants. Suitable surfactants include siloxane-containing polymers, fluorine-containing polymers and polymers with ethylene oxide and/or propylene oxide groups. They are preferably present in an amount of 0 to 10 wt.-%, based on the dry layer weight, especially preferred 0.2 to 5 wt.-%.

Further optional components of the radiation-sensitive coating include e.g. inorganic fillers such as e.g. $Al_2O_3$ and $SiO_2$. They are preferably present in an amount of 0 to 20 wt.-%, based on the dry layer weight, especially preferred 0.1 to 5 wt.-%.

Exposure indicators, such as e.g. 4-phenylazodiphenylamine, can also be present as optional components of the radiation-sensitive coating; they are preferably present in an amount of 0 to 5 wt.-%, especially preferred 0 to 2 wt.-%, based on the dry layer weight.

The radiation-sensitive elements of the present invention can for example be printing plate precursors (in particular precursors of lithographic printing plates), printed circuit boards for integrated circuits or photomasks.

A dimensionally stable plate or foil-shaped material is preferably used as a substrate in particular in the production of printing plate precursors. Preferably, a material is used as dimensionally stable plate or foil-shaped material that has already been used as a substrate for printing plates. Examples of such substrates include paper, paper coated with plastic materials (such as polyethylene, polypropylene, polystyrene), a metal plate or foil, such as e.g. aluminum (including aluminum alloys), zinc and copper plates, plastic films made e.g. from cellulose diacetate, cellulose triacetate, cellulose propionate, cellulose acetate, cellulose acetate-butyrate, cellulose nitrate, polyethylene terephthalate, polyethylene, polystyrene, polypropylene, polycarbonate and polyvinyl acetate, and a laminated material made from paper or a plastic film and one of the above-mentioned metals, or a paper/plastic film that has been metallized by vapor deposition.

Among these substrates, an aluminum plate or foil is especially preferred since it shows a remarkable degree of dimensional stability; is inexpensive and furthermore exhibits excellent adhesion to the coating. Furthermore, a composite film can be used wherein an aluminum foil has been laminated onto a polyethylene terephthalate film.

A metal substrate, in particular an aluminum substrate, is preferably subjected to at least one treatment selected from graining (e.g. by brushing in a dry state or brushing with abrasive suspensions, or electrochemical graining, e.g. by means of a hydrochloric acid electrolyte), anodizing (e.g. in sulfuric acid or phosphoric acid) and hydrophilizing.

In order to improve the hydrophilic properties of the surface of the metal substrate that has been grained and optionally anodized in sulfuric acid or phosphoric acid, the metal substrate can be subjected to an aftertreatment with an aqueous solution of e.g. sodium silicate, calcium zirconium fluoride, polyvinylphosphonic acid or phosphoric acid. Within the framework of the present invention, the term "substrate" also encompasses an optionally pretreated substrate exhibiting, for example, a hydrophilizing layer on its surface.

The details of the above-mentioned substrate pre-treatment are known to the person skilled in the art.

For producing a radiation-sensitive element, the radiation-sensitive composition of the present invention is applied to the surface of the substrate by means of common coating processes (e.g. spin coating, dip coating, coating by means of doctor blades). It is also possible to apply the radiation-sensitive composition on both sides of the substrate; however, for the elements of the present invention, it is preferred that the radiation-sensitive coating be only applied to one side of the substrate.

For this purpose, the radiation-sensitive composition comprises one or more organic solvents.

Suitable solvents include low alcohols (e.g. methanol, ethanol, propanol and butanol), glycolether derivatives (e.g. ethyleneglycol monomethylether, ethyleneglycol dimethylether, propyleneglycol monomethylether, ethyleneglycol monomethylether acetate, ethyleneglycol monoethylether acetate, propyleneglycol monomethylether acetate, propyleneglycol monoethylether acetate, ethyleneglycol monoisopropylether acetate, ethyleneglycol monobutylether acetate, diethyleneglycol monomethylether, diethyleneglycol monoethylether), ketones (e.g. diacetone alcohol, acetyl acetone, acetone, methyl ethyl ketone, cyclohexanone, methyl isobutyl ketone), esters (e.g. methyl lactate, ethyl lactate, acetic acid ethyl ester, 3-methoxypropyl acetate and butyl acetate), aromatics (e.g. toluene and xylene), cyclohexane, methoxymethoxyethanol, γ-butyrolactone, methoxypropanol and dipolar aprotic solvents (e.g. THF, dimethylsulfoxide, dimethylformamide and N-methylpropyrrolidone). The solids content of the radiation-sensitive mixture to be applied depends on the coating method that is used and is preferably 1 to 50 wt.-%.

The dry layer weight of the radiation-sensitive layer is preferably 0.5 to 4 g/m$^2$, more preferred 0.8 to 3 g/m$^2$.

The additional application of an overcoat layer onto the radiation-sensitive layer can be advantageous. The overcoat layer has to be permeable to the radiation used for imaging. The overcoat layer protects the radiation-sensitive layer from mechanical wear as well as from the inhibiting effect atmospheric oxygen has on the radiation-sensitive coating. Preferably, water-soluble polymers are used for the overcoat layer, such as polyvinyl alcohol, polyvinyl alcohovpolyvinyl acetate copolymers, polyvinyl pyrrolidone, polyvinyl pyrrolidone/polyvinyl acetate copolymers, polyvinyl methylethers, ring-opened copolymers of maleic acid anhydride and a comonomer such as methylvinylether, polyacrylic acid, cellulose ether, gelatin, etc.; polyvinyl alcohol is preferred. In order to improve the adhesion of the overcoat layer on the radiation-sensitive layer, the overcoat composition can comprise a common adhesion promoter such as e.g. poly(vinylimidazole). Preferably, the composition for the oxygen-impermeable overcoat layer is applied in the form of a solution in water or in a solvent miscible with water; in any case, the solvent is selected such that the radiation-sensitive coating already present on the substrate does not dissolve. The layer weight of the overcoat layer can e.g. be 0.1 to 6 g/m$^2$, preferably 0.5 to 4 g/m$^2$. However, the printing plate precursors according to the present invention show excellent properties even without an overcoat layer. The overcoat layer can also comprise matting agents (i.e. organic or inorganic particles with a particle size of 2 to 20 μm) which facilitate the planar positioning of the film during contact exposure.

Suitable overcoat layers are described for example in WO 99/06890.

The thus produced radiation-sensitive elements are image-wise exposed in a manner known to the person skilled in the art with UV radiation (preferably 250 to 450 nm, more preferred 350 to 450 nm) and subsequently developed with a commercially available aqueous alkaline developer. Mercury lamps doped with metal halogenides and diodes emitting UV light (UV-LED) can for example be used as a radiation source. UV laser diodes emitting UV radiation in the range of about 405 nm (e.g. 405±10 nm) are of particular interest as a radiation source.

After image-wise exposure, i.e. prior to developing, a heat treatment can be carried out at 50 to 180° C., preferably 90 to 150° C. The developed elements can be treated with a preservative ("gumming") using a common method. The preservatives are aqueous solutions of hydrophilic polymers, wetting agents and other additives.

For certain applications (e.g. in the case of printing plates), it is furthermore advantageous to increase the mechanical strength of the portions of the coating remaining after developing by subjecting them to a heat treatment (what is referred as "baking") and/or a combination of baking and overall exposure (e.g. to UV light). For this purpose, prior to the treatment, the developed element is treated with a solution that protects the non-image areas such that the heat treatment does not cause these areas to accept ink. A solution suitable for this purpose is e.g. described in U.S. Pat. No. 4,355,096. Baking takes place at a temperature in the range of 150 to 250° C. However, elements as well as printing plates prepared from radiation-sensitive elements according to the present invention show excellent properties even without having been subjected to a heat treatment. When both baking and overall exposure are carried out, the two treatment steps can be performed simultaneously or one after the other.

The radiation-sensitive elements according to the present invention are characterized by excellent stability under yellow light conditions, a high degree of photosensitivity and excellent resolution in combination with good storage stability. In the case of printing plate precursors, the developed printing plates exhibit excellent abrasion resistance which allows a large number of copies.

The invention will be explained in more detail in the following examples.

EXAMPLES

Preparation Examples 1 to 5

The monomers 1 to 5 were prepared according to the following general process:

The appropriate diisocyanate, dibutyltin dilaurate and 2,6-di-tert.-butyl-4-methylphenol were dissolved in methyl ethyl ketone at 40° C. Hydroxyethyl methacrylate and the corresponding difunctional OH/NH compound were added in such a manner that the temperature did not exceed 42° C. After 2 hours of stirring, the temperature was increased to 60° C. and left there for another 2 hours. The reaction of the isocyanate was monitored by means of IR spectroscopy; remaining isocyanate was reacted with 5 ml methanol for another 2 hours at 60° C. Details regarding the compounds used and their amounts can be inferred from the following table.

TABLE 1

| Starting materials | Preparation Example 1 (Monomer 1) | Preparation Example 2 (Monomer 2) | Preparation Example 3 (Monomer 3) | Preparation Example 4 (Monomer 4) | Preparation Example 5 (Monomer 5) |
|---|---|---|---|---|---|
| Hexamethylene diisocyanate | 16.82 g | 16.82 g | — | — | — |
| Trimethylhexamethylene diisocyanate | — | — | 21.03 g | 21.03 g | 21.03 g |
| Hydroxyethyl-methacrylate | 13.01 g | 13.01 g | 13.01 g | 13.01 g | 13.01 g |
| 2-(2-Hydroxyethyl)-piperidine | 6.46 g | — | 6.46 g | — | — |
| 2-(Hydroxymethyl)-piperidine | — | 5.76 g | — | — | — |
| 3-(Hydroxymethyl)-piperidine | — | — | — | 5.76 g | — |
| N-(2-Hydroxyethyl)-piperazine | — | — | — | — | 6.51 g |
| Dibutyltin dilaurate | 0.076 g | 0.076 g | 0.095 g | 0.095 g | 0.095 g |
| 2,6-Di-tert.-butyl-4-methylphenol | 0.025 g | 0.025 g | 0.032 g | 0.032 g | 0.032 g |
| Methyl ethyl ketone | 85 g | 83 g | 95 g | 93 g | 95 g |
| Solids content | 29.8 wt.-% | 29.2 wt.-% | 32.0 wt.-% | 31.6 wt.-% | 32.7 wt.-% |

Preparation Example 6

3,3',6,6'-Tetramethyl-9-phenyl-1,2,3,4,5,6,7,8,9,10-decahydroacridine-1,8-dione (Compound Ia wherein $R^6$=phenyl, $R^{8a}$=$R^{8b}$=$R^{9a}$=$R^{9b}$=$CH_3$, $R^{8c}$=$R^{8d}$=$R^{9c}$=$R^{9d}$=H, Z=$CH_2$, $R^1$=H)

5.3 g benzaldehyde, 14 g 5,5-dimethyl-1,3-cyclohexanedione (available from Aldrich) and 4.5 g ammonium acetate were dissolved in 35 ml methanol. This mixture was refluxed for 5 hours. The precipitation formed after cooling was filtered off, recrystallized in methanol and dried in a vacuum oven for one day at 40° C. Yield: 13.4 g (77%).

Examples 1 to 10 and Comparative Examples 1 to 8

An electrochemically grained (in HCl) and anodized aluminum foil was subjected to a treatment with an aqueous solution of polyvinylphosphonic acid (PVPA) and, after drying, coated with a solution as described in Table 2. Details regarding the monomers, stabilizers and coinitiators used can be inferred from Table 3.

TABLE 2

| | |
|---|---|
| 0.22 g | Copolymer of 80 mole-% allyl methacrylate and 20 mole-% methacrylic acid with an acid number of 95 mg KOH/1 g |
| 0.1 g | Kayamer PM-2 (1 mole phosphoric acid esterified with 1.5 moles hydroxyethyl methacrylate); available from Coa Corp. Ltd./Japan) |
| 0.31 g | mercapto-1,2,4-triazole |
| 2.3 g | of a dispersion in propylene glycol monomethyl ether comprising 21.1 wt.-% copper phthalocyanine and 2.1 wt.-% of a polyvinylacetal binder comprising 39.9 mole-% vinyl alcohol groups, 1.2 mole-% vinyl acetate groups, 15.4 mole-% acetal groups derived from acetaldehyde, 36.1 mole-% acetal groups derived from butyric aldehyde and 7.4 mole-% acetal groups derived from 4-formylbenzoic acid |
| X g | monomer (according to Table 3) |
| Y g | sensitizer (according to Table 3) |
| Z g | coinitiator (according to Table 3) |
| 22.8 ml | propylene glycol monomethyl ether |
| 16.3 ml | methanol |
| 26 ml | methyl ethyl ketone |

The solution was filtered, applied onto the lithographic substrate and the coating was dried for 5 minutes at 90° C. The dry layer weight of the photopolymer layer was about 1.7 g/m².

An overcoat layer was applied onto the thus obtained samples by coating them with an aqueous solution of polyvinyl alcohol (Airvol 203 from Airproducts, degree of hydrolysis 88%); after drying at 90° C. for 4 minutes, the overcoat had a dry layer weight of about 2.5 g/m².

The printing plate precursor was exposed with a violet laser diode (405 nm) with an energy of 200 μJ/cm² using a silver film gray scale having a tonal range of 0.15 to 1.95, wherein the density increments amounted to 0.15 (UGRA gray scale). Immediately after exposure, the plate was heated in an oven for 2 minutes at 90° C.

Then the exposed plate precursor was treated for 30 seconds with a developer solution comprising the following components:

3.4 parts by weight Rewopol NLS 28® (available from REWO)

1.1 parts by weight diethanolamine 1.0 parts by weight Texapon 842® (available from Henkel)

0.6 parts by weight Nekal BX Paste® (available from BASF)

0.2 parts by weight 4-toluenesulfonic acid 3.0 parts by weight phenoxyethanol and 93.7 parts by weight water Then the developer solution was again rubbed over the surface for another 30 seconds using a tampon and then the entire plate was rinsed with water. After this treatment, the exposed portions remained on the plate. For the assessment of its photosensitivity, the plate was blackened in a wet state with printing ink.

For the assessment of storage stability, the unexposed printing plate precursors were stored for 60 minutes in a 90° C. oven, then exposed and developed as described above (storage stability test). The aged plates were used for printing and examined with respect to toning. Plates that did not show any toning during printing and whose gray scale status did not deteriorate by more than one step during storage were rated stable.

For the assessment of yellow light stability, the plate was irradiated with an Osram lamp L36W/62, which delivers yellow light, with an intensity of light of 900 lux and then developed as described above. The exposure time that leads to the formation of fog on the plate is used as the measure of yellow light stability (yellow light stability test).

For the preparation of a lithographic printing plate, an imaging layer was applied to the aluminum foil, as explained above, exposed, heated, developed, and after rinsing with water, the developed plate was rubbed and gummed with an aqueous solution of 0.5% phosphoric acid and 6% gum arabic. The thus prepared plate was loaded in a sheet-fed offset printing machine and an abrasive printing ink (Offset S 7184 available from Sun Chemical, containing 10% potassium carbonate) was used.

The results are summarized in Table 3.

TABLE 3

| Example | Monomer[4] X g | Sensitizer[1] Y g | Coinitiator[2] Z g | Gray scale 405 nm[3] | Yellow light stability [min] | Abrasion resistance (number of copies) | Storage stability |
|---|---|---|---|---|---|---|---|
| 1 | Monomer 1 15.25 | Sensitizer 1 0.7 | Coinitiator 1 0.17 | 4/11 | >60 | no abrasion up to 80,000 copies | stable |
| 2 | Monomer 2 15.25 | Sensitizer 1 0.7 | Coinitiator 1 0.17 | 4/11 | >60 | no abrasion up to 80,000 copies | stable |
| 3 | Monomer 3 15.25 | Sensitizer 1 0.7 | Coinitiator 1 0.17 | 4/10 | >60 | no abrasion up to 80,000 copies | stable |
| 4 | Monomer 4 15.25 | Sensitizer 1 0.7 | Coinitiator 1 0.17 | 3/10 | >60 | no abrasion up to 80,000 copies | stable |
| 5 | Monomer 5 15.25 | Sensitizer 1 0.7 | Coinitiator 1 0.17 | 3/10 | >60 | no abrasion up to 80,000 copies | stable |
| 6 | Monomer 1 15.25 | Sensitizer 1 0.7 | Coinitiator 2 0.17 | 2/8 | >120 | no abrasion up to 80,000 copies | stable |
| 7 | Monomer 1 15.25 | Sensitizer 1 0.7 | Coinitiator 5 0.17 | 2/8 | >120 | no abrasion up to 80,000 copies | stable |
| 8 | Monomer 1 15.25 | Sensitizer 1 0.7 | Coinitiator 7 0.17 | 3/9 | >120 | no abrasion up to 80,000 copies | stable |
| 9[5] | Monomer 1 15.25 | Sensitizer 1 0.7 | Coinitiator 1 0.17 | 4/12 | >60 | no abrasion up to 80,000 copies | stable; developability somewhat slower than Example 1 |
| 10 | Monomer 1 15.25 | Sensitizer 1 0.5 | Coinitiator 1 0.17 | 2/8 | >120 | no abrasion up to 80,000 copies | stable |
| Comparative 1 | Urethane acrylate | Sensitizer 1 0.7 | Coinitiator 1 0.17 | 2/9 | >60 | abrasion after 50,000 copies | stable |
| Comparative 2 (EP 287818) | Monomer 1 15.25 | Sensitizer 3 0.1 | — | no image | — | — | — |
| Comparative 3 (DE 3832032) | Monomer 1 15.25 | Sensitizer 4 0.1 | Coinitiator 2 0.15 + Coinitiator 3 0.1 | 1/7 | <1 | abrasion after 10,000 copies | toning |
| Comparative 4 | Monomer 1 15.25 | Sensitizer 1 0.7 | Coinitiator 4 0.17 | no image | — | — | — |
| Comparative 5 | Monomer 1 15.25 | Sensitizer 2 0.7 | Coinitiator 3 0.1 Coinitiator 5 0.3 | 3/10 | <1 | no abrasion up to 80,000 copies | slight toning |
| Comparative 6 | Monomer 1 15.25 | Sensitizer 1 0.7 | Coinitiator 6 0.2 | no image | — | — | — |
| Comparative 7 | Monomer 1 15.25 | Sensitizer 5 0.091 | Coinitiator 6 0.2 | 2/8 | >60 | abrasion after 50,000 copies | slight toning |

TABLE 3-continued

| Example | Monomer[4] X g | Sensitizer[1] Y g | Coinitiator[2] Z g | Gray scale 405 nm[3] | Yellow light stability [min] | Abrasion resistance (number of copies) | Storage stability |
|---|---|---|---|---|---|---|---|
| Comparative 8 | Monomer 1 15.25 | Sensitizer 6 0.091 | Coinitiator 6 0.2 | 3/9 | <15 | no abrasion up to 80,000 copies | stable |

[1]Sensitizer 1: 2-phenyl-4-(2-chlorophenyl)-5-(4-diethylaminophenyl)-oxazole-1,3
Sensitizer 2: 7-diethylaminocoumarin-3-carboxylic acid ethyl ester
Sensitizer 3: 9-phenylacridine
Sensitizer 4: ethyleosin
Sensitizer 5: 2,2'-(2,5-thiophendiyl)bis(tert.-butylbenzoxazole)
Sensitizer 6: 3-carbethoxy-7-(diethylamino)coumarin
Sensitizer 7: dihydropyridine derivative from Preparation Example 6
[2]Coinitiator 1: 2,2-bis-(2-chlorophenyl)-4,5,4',5'-tetraphenyl-2'H-[1,2']biimidazolyl
Coinitiator 2: 2,4-bis-trichloromethyl-6-(4-styryl)-s-triazine
Coinitiator 3: dicyclopentadienyl-bis-pentafluorophenyl-titanium
Coinitiator 4: 4-diethylamino-2-methoxy-benzoldiazonium-hexafluorophosphate
Coinitiator 5: diphenyliodonium-hexafluorophosphate
Coinitiator 6: triphenylmethylphosphonium-hexafluorophosphate
Coinitiator 7: 4-phenyl-1-methoxypyridinium-hexyfluorophosphate
[3]The first value indicates the solid steps of the blackened gray scale and the second value indicates the first step that did not accept printing ink.
[4]Monomer 1 to 5: see Table 1
Urethane acrylate: Prepared by reacting Desmodur N 100 ® ((biuret of hexamethylene diisocyanate; available from Bayer) with hydroxyethyl acrylate and pentaerythritol triacrylate; amount of double bonds: 0.5 double bonds per 100 g, when all isocyanate groups have reacted with the acrylates containing hydroxyl groups.
[5]Differs from Example 1 in that no Kayamer PM-2 was used.

The plates produced according to the present invention exhibit a high degree of sensitivity and good abrasion resistance during printing. Comparative Example 1 shows that the use of urethane acrylate results in plates with a lower sensitivity and inferior abrasion resistance.

The sensitizer system used in EP-A-287 818 (Comparative Example 2) and DE-A-38 32 032 (Comparative Example 3) leads to plates having a much lower sensitivity and also, in the case of Comparative Example 3, inferior yellow light stability.

Comparative Examples 4 and 6 show that diazonium compounds and phosphonium compounds are not suitable as coinitiators; no image can be obtained.

It can be inferred from Comparative Example 5 that the presence of a metallocene coinitiator—in combination with a coinitiator according to the present invention—leads to a drastic deterioration of the yellow light stability.

A comparison of Examples 1 and 9 shows that the additional use of a P—OH monomer has a positive effect on developability, i.e. that it accelerates developing.

The above Examples demonstrate that by using the compositions according to the present invention, lithographic printing plate precursors can be produced which exhibit a high degree of sensitivity and are furthermore characterized by excellent yellow light stability and storage stability; moreover, printing plates produced from these precursors are particularly abrasion-resistant.

The invention claimed is:

1. A radiation-sensitive composition comprising
(a) at least one photopolymerizable compound with at least one ethylenically unsaturated group accessible to a free-radical polymerization, wherein the at least one photopolymerizable compound has a molecular weight of 3,000 or less and is obtained by reacting a diisocyanate with (i) an ethylenically unsaturated compound with a hydroxy group, and at the same time (ii) a saturated organic compound with an NH group and an OH group, wherein the reactants are used in amounts according to the following condition:
Number of moles of isocyanate groups≦number of moles of OH plus NH groups;

(b) at least one sensitizer which absorbs radiation from the wavelength range of 250 to 450 nm of the electromagnetic spectrum and is selected from:

(i) a 1,4-dihydropyridine derivative of formula (I)

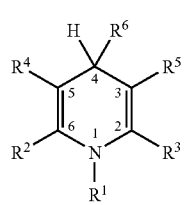

(I)

wherein $R^1$ is selected from a hydrogen atom, —C(O)OR$^7$, an optionally substituted alkyl group, an optionally substituted aryl group and an optionally substituted aralkyl group, $R^2$ and $R^3$ are independently selected from optionally substituted alkyl groups, optionally substituted aryl groups, CN and a hydrogen atom, $R^4$ and $R^5$ are independently selected from —C(O)OR$^7$, —C(O)R$^7$, —C(O)NR$^8$R$^9$ and CN, or $R^2$ and $R^4$ together form an optionally substituted phenyl ring or a 5- to 7-membered carbocyclic or heterocyclic ring, wherein the unit

is present in the carbocyclic or heterocyclic ring adjacent to position 5 of the 1,4-dihydropyridine ring and wherein the carbocyclic or heterocyclic ring optionally comprises additional substituents, or both $R^2$ and $R^4$ as well as $R^3$ and $R^5$ form either optionally substituted phenyl rings or 5- to 7-membered carbocyclic or heterocyclic rings, wherein the unit

is present in the carbocyclic or heterocyclic rings adjacent to positions 3 and 5 of the dihydropyridine ring and wherein the carbocyclic or heterocyclic rings optionally comprise additional substituents, or one of the pairs $R^2/R^4$ and $R^3/R^5$ forms a 5- to 7-membered carbocyclic or heterocyclic ring, wherein the unit

is present in the carbocyclic or heterocyclic ring adjacent to position 5 or 3 of the dihydropyridine ring and wherein the carbocyclic or heterocyclic ring optionally comprises additional substituents and the other pair forms an optionally substituted phenyl ring, or $R^2$ and $R^1$ or $R^3$ and $R^1$ form a 5- to 7-membered heterocyclic ring which can optionally comprise one or more substituents and which, in addition to the nitrogen atom it shares with the 1,4-dihydropyridine ring, optionally comprises additional nitrogen atoms, —$NR^{13}$ groups, —S— or —O—, $R^{13}$ is selected from a hydrogen atom, an alkyl group, aryl group and aralkyl group, $R^6$ is selected from an alkyl group optionally substituted with a halogen atom or a —C(O) group, an optionally substituted aryl group, an optionally substituted aralkyl group, an optionally substituted heterocyclic group and the group

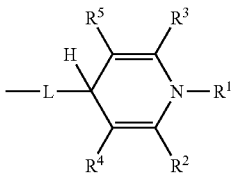

wherein
L is an alkylene or arylene group and $R^1$ to $R^5$ are as defined above for formula (I), $R^7$ is a hydrogen atom, aryl group, aralkyl group or alcyl group, wherein the alkyl group and the alkyl unit of the aralkyl group optionally comprise one or more C-C double and/or C-C triple bonds, and $R^8$ and $R^9$ are independently selected from a hydrogen atom, an optionally substituted alkyl group, an optionally substituted aryl group and an optionally substituted aralkyl group; and (ii) an oxazole compound of formula (II)

(II)

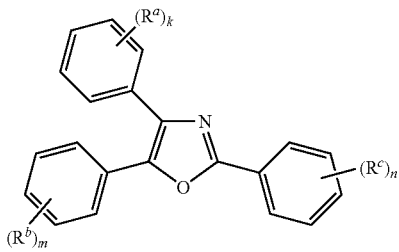

wherein each $R^a$, $R^b$ und $R^c$ is independently selected from a halogen atom, an optionally substituted alkyl group, an optionally substituted aryl group, which may also be fused, an optionally substituted aralkyl group, a group —NR'R" and a group —OR''', wherein R' and R" are independently selected from a hydrogen atom, an alkyl, aryl or aralkyl group, R''' is an optionally substituted alkyl, aryl or aralkyl group or a hydrogen atom and k, m and n are independently 0 or an integer from 1 to 5;

(c) at least one coinitiator capable of forming free radicals together with the sensitizer (b) and selected from 2,2',4,4',5,5'-hexaarylbiimidazoles, compounds with at least one photolytically cleavable trihalogenmethyl group, diaryliodonium salts, triarylsulfonium salts and N-heterocyclic compounds with at least one nitrogen atom in the ring, having an oxy substituent at at least one ring nitrogen atom, and mixtures of the above compounds; and (d) optionally one or more components selected from alkali-soluble binders, colorants, exposure indicators, plasticizers, chain transfer agents, leuco dyes, surfactants, inorganic fillers and thermopolymerization inhibitors; and additionally comprising at least one component with at least one ethylenically unsaturated free-radical polymerizable group and at least one P-OH group, with the proviso that the radiation-sensitive composition does not comprise a metallocene.

2. The radiation-sensitive composition according to claim 1, wherein a hexaarylbiimidazole is used as coinitiator.

3. The radiation-sensitive composition according to claim 1, wherein the component with the ethykuically unsaturated group and the P-OH group is a compound of formula (III) or (IV):

(III)

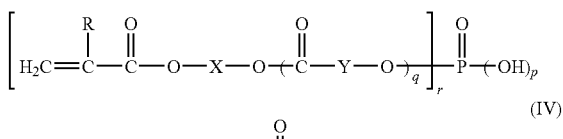

(IV)

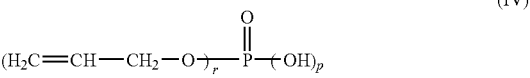

wherein r is 1 or 2, q is 0 or 1, p is 1or 2, r+p=3, R represents $C_1$-$C_{12}$ alkyl, X represents $C_2$-$C_{12}$ alkylene and Y is $C_2$-$C_{12}$ alkylene.

4. The radiation-sensitive composition according to claim 1 wherein the diisocyanate is a compound of formula (VI)

$$O=C=N—(CR^{14}_2)_a\text{-}D\text{-}(CR^{14}_2)_b—N=C=O \qquad (VI)$$

wherein a and b independently represent 0 or an integer from 1 to 3, each $R^{14}$ is independently selected from H and $C_1$-$C_3$ alkyl and D is a saturated or unsaturated, chain-shaped or ring-shaped spacer.

5. The radiation-sensitive composition according to claim 1 wherein the ethylenically unsaturated compound with a hydroxy group is at least one compound selected from hydroxy($C_1$-$C_{12}$)alkyl(meth)acrylates, hydroxy($C_1$- $C_{12}$) alkyl(meth)acrylamides, mono(meth)acrylates of oligomeric or polymeric ethylene glycols or propylene glycols, allyl alcohol, pentaerythritol tri(meth)acrylate, 4-hydroxy($C_1$-$C_{12}$)alkylstyrene, 4-hydroxystyrene and hydroxycyclohexyl (meth)acrylate.

6. The radiation-sensitive composition according to claim 1 wherein the saturated compound with an NH group and an OH group is a compound of formula VII or VIII or a mixture thereof:

$$R^{15}-N(H)-E-OH \quad (VII)$$

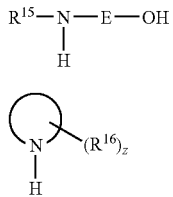
(VIII)

wherein $R^{15}$ is a straight-chain, branched or cyclic alkyl group, E is a straight-chain, branched or cyclic alkylene group,

represents a saturated heterocyclic ring with 5 to 7 ring atoms, which optionally comprises an additional heteroatom selected from S, O and $NR^{17}$, $R^{16}$ is OH or an alkyl group substituted with an OH group, $R^{17}$ is an alkyl group optionally substituted with an OH group, z=0 if the heterocyclic ring comprises $NR^{17}$ and $R^{17}$ is an alkyl group substituted with OH and z=1 if the heterocyclic ring does not comprise $NR^{17}$ or if the heterocyclic ring comprises $NR^{17}$ and $R^{17}$ is an unsubstituted alkyl group.

7. The radiation-sensitive composition according to claim 1 wherein the diisocyanate is selected from hexamethylene diisocyanate and trimethylhexamethylene diisocyanate, the ethylenically unsaturated compound (i) is selected from esters of (meth)acrylic acid with an at least divalent alcohol, and the compound (ii) is selected from piperidines and piperazines comprising an OH group bonded directly or via a spacer.

8. The radiation-sensitive composition according to claim 1, additionally comprising one or more chain transfer agents.

9. A negative working radiation-sensitive element comprising
(a) an optionally pretreated substrate and
(b) a radiation-sensitive coating prepared from the composition as defined in claim 1 applied onto the substrate.

10. The negative working radiation-sensitive element according to claim 9, wherein the substrate is an aluminum foil or plate, wherein prior to coating, the aluminum plate or foil was subjected to at least one treatment selected from gaining, anodizing and hydrophilizing.

11. The negative working radiation-sensitive element according to claim 9, wherein the element furthermore comprises an oxygen-impermeable overcoat layer.

12. The negative working radiation-sensitive element of claim 9, wherein the coinitiator is a hexaarylbiimidazole; wherein the diisocyanate is a compound of formula (VI)

$$O=C=N-(CR^{14}_2)_a-D-(CR^{14}_2)_b-N=C=O \quad (VI)$$

wherein a and b independently represent 0 or an integer from 1 to 3, each $R^{14}$ is independently selected from H and $C_1$-$C_3$ alkyl and D is a saturated or unsaturated, chain-shaped or ring-shaped spacer, and wherein the saturated compound with an NH group and an OH group is a compound of formula VII or VIII or a mixture thereof:

$$R^{15}-N(H)-E-OH \quad (VII)$$

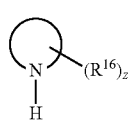
(VIII)

wherein $R^{15}$ a straight-chain, branched or cyclic alkyl group, E is a straight-chain, branched or cyclic alkylene group,

represents a saturated heterocyclic ring with 5 to 7 ring atoms, which optionally comprises an additional heteroatom selected from S, O and $NR^{17}$, $R^{16}$ is OH or an alkyl group substituted with an OH group, $R^{17}$ is an alkyl group optionally substituted with an OH group, z=0 if the heterocyclic ring comprises $NR^{17}$ and $R^{17}$ is an alkyl group substituted with OH and z=1 if the heterocyclic ring does not comprise $NR^{17}$ or if the heterocyclic ring comprises $NR^{17}$ and $R^{17}$ an unsubstituted alkyl group.

13. A process for imaging a radiation-sensitive element comprising
(a) providing a negative working radiation-sensitive element of claim 9;
(b) image-wise irradiation of the element with UV radiation of a wavelength in the range of 250 to 450 nm;
(c) optionally heating of the image-wise irradiated element;
(d) removing the non-irradiated areas of the coating by means of an aqueous alkaline developer;
(e) optionally heating the developed element and/or subjecting it to overall exposure.

14. The process according to claim 13, wherein the image-wise irradiation is carried out with UV radiation of a wavelength in the range of 400 to 450 nm.

15. An imaged element obtained according to the process of claim 13.

16. The imaged element according to claim 15, wherein the element is a lithographic printing form.

17. A process forte production of a radiation-sensitive element comprising
(a) providing an optionally pretreated substrate,
(b) providing a radiation-sensitive composition comprising
(i) at least one photopolymerizable compound as defined in claim 1;
(ii) at least one sensitizer which absorbs radiation from the wavelength range of 250 to 450 mn of the electromagnetic spectrum and is selected from:
a 1,4-dihydropyridine derivative of formula (I)

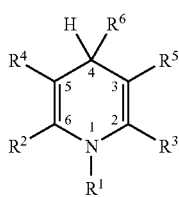

(I)

wherein
R[1] is selected from a hydrogen atom, —C(O)OR[7], an optionally substituted alkyl group, an optionally substituted aryl group and an optionally substituted aralkyl group,
R[2] and R[3] are independently selected from optionally substituted alkyl groups, optionally substituted aryl groups, CN and a hydrogen atom,
R[4] and R[5] are independently selected from —C(O)OR[7], —C(O)R[7], —C(O)NR[8]R[9] and CN,
or R[2] and R[4] together form an optionally substituted phenyl ring or a 5- to 7-membered carbocyclic or heterocyclic ring, wherein the unit

is present in the carbocyclic or heterocyclic ring adjacent to position 5 of the 1,4-dihydropyridine ring and wherein the carbocyclic or heterocyclic ring optionally comprises additional substituents,
or both R[2] and R[4] as well as R[3] and R[5] form either optionally substituted phenyl rings or 5- to 7-membered carbocyclic or heterocyclic rings, wherein the unit

is present in the carbocyclic or heterocyclic rings adjacent to positions 3 and 5 of the dihydropyridine ring and wherein the carbocyclic or heterocyclic rings optionally comprise additional substituents,
or one of the pairs R[2]/R[4] and R[3]/R[5] forms a 5- to 7-membered carbocyclic or heterocyclic ring, wherein the unit

is present in the carbocyclic or heterocyclic ring adjacent to position 5 or 3 of the dihydropyridine ring and wherein the carbocyclic or heterocyclic ring optionally comprises additional substituents and the other pair forms an optionally substituted phenyl ring,
or R[2] and R[1] or R[3] and R[1] forms a 5- to 7-membered heterocyclic ring which can optionally comprise one or more substituents and which, in addition to the nitrogen atom it shares with the 1,4-dihydropyridine ring, optionally comprises additional nitrogen atoms, —NR[13] groups, —S— or —O—,
R[13] is selected from a hydrogen atom, an alkyl group, aryl group and aralkyl group,
R[6] is selected from an alkyl group optionally substituted with a halogen atom or a —C(O) group, an optionally substituted aryl group, an optionally substituted aralkyl group, an optionally substituted heterocyclic group and the group

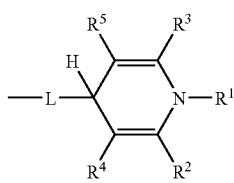

wherein
L is an alkylene or arylene group and R[1] to R[5] are as defined above for formula (I),
R[7] is a hydrogen atom, aryl group, aralkyl group or alkyl group, wherein the alkyl group and the alkyl unit of the aralkyl group optionally comprise one or more C-C double and/or C-C triple bonds, and
R[8] and R[9] we independently selected from a hydrogen atom, an optionally substituted alkyl group, an optionally substituted aryl group and an optionally substituted aralkyl group and an oxazole compound of formula (IL)

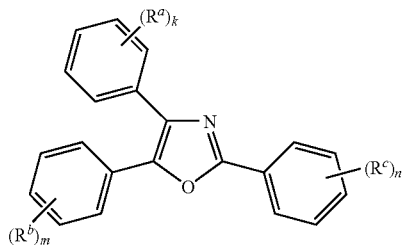

(II)

wherein each R[a], R[b] und R[c] is independently selected from a halogen atom, an optionally substituted alkyl group, an optionally substituted aryl group, which may also be fused, an optionally substituted aralkyl group, a group —NR'R" and a group —OR''', wherein R' and R" are independently selected from a hydrogen atom, an alkyl, aryl or aralkyl group,
R''' is an optionally substituted alkyl, aryl or aralkyl group or a hydrogen atom and
k, m and n are independently 0 or an integer from 1 to 5;
(iii) at least one coinitiator capable of forming free radicals together with the sensitizer (b) and selected from 2,2',4,4',5,5'-hexaaryl biimidazoles, compounds with at least one photolytically cleavable trihalogenmethyl group, diaryliodonium salts, triarylsulfonium salts and N-heterocyclic compounds with at least one nitrogen atom in the ring, having an oxy substituent at at least one ring nitrogen atom, and mixtures of the above compounds;
(iv) optionally one or more components selected from alkali-soluble binders, colorants, exposure indicators, plasticizers, chain transfer agents, leuco dyes, surfactants, inorganic fillers and thermopolymerization inhibitors, and
(v) at least one solvent, and additionally comprising at least one component with at least one ethylenically unsaturated free-radical polymerizable group and at least one P—OH group.

with the proviso that the radiation-sensitive composition does not comprise a metallocene;

c) applying the radiation-sensitive composition onto the substrate;

d) drying.

18. The process according to claim 17, wherein the substrate provided in step (a) is an aluminum substrate that has been subjected to at least one treatment selected from graining, anodizing and hydrophilizing.

* * * * *

UNITED STATES PATENT AND TRADEMARK OFFICE
CERTIFICATE OF CORRECTION

Page 1 of 3

PATENT NO. : 7,574,959 B2
APPLICATION NO. : 10/580357
DATED : August 18, 2009
INVENTOR(S) : Harald Baumann et al.

It is certified that error appears in the above-identified patent and that said Letters Patent is hereby corrected as shown below:

| Column | Line | Description of Error |
|---|---|---|
| Title page Item [57] (Abstract) | 17 | Delete "5'5" and insert -- 5,5' --, therefor. |
| 27 | 46 | In Claim 1, delete "ailcyl" and insert -- alkyl --, therefor. |
| 28 | 1 | In Claim 1, delete "und" and insert -- and --, therefor. |
| 28 | 7 | In Claim 1, after "hydrogen atom," delete "an alkyl, aryl or aralkyl group," and insert the same on Line 8 as a new line. |
| 28 | 11 | In Claim 1, delete "fonning" and insert -- forming --, therefor. |
| 28 | 27 | In Claim 1, delete "polvmerizable" and insert -- polymerizable --, therefor. |
| 28 | 33 | In Claim 3, delete "ethykuically" and insert -- ethylenically --, therefor. |
| 28 | 46 | In Claim 3, delete "1or 2" and insert -- 1 or 2 --, therefor. |

Signed and Sealed this
Twenty-fourth Day of April, 2012

David J. Kappos
*Director of the United States Patent and Trademark Office*

CERTIFICATE OF CORRECTION (continued)
U.S. Pat. No. 7,574,959 B2

| | | |
|---|---|---|
| 28 | 62-67 | In Claim 5, delete "hydroxy($C_1$-$C_{12}$)alkyl(meth)acrylates, hydroxy($C_1$-$C_{12}$)alkyl(meth)acrylamides, mono(meth)acrylates of oligomeric or polymeric ethylene glycols or propylene glycols, allyl alcohol, pentaerythritol tri(meth)acrylate, 4-hydroxy($C_1$- $C_{12}$)alkylstyrene, 4-hydroxystyrene and hydroxycyclohexyl(meth)acrylate." and insert -- hydroxy($C_1$-$C_{12}$)alkyl(meth)acrylates, hydroxy($C_1$-$C_{12}$)alkyl(meth)acrylamides, mono(meth)acrylates of oligomeric or polymeric ethylene glycols or propylene glycols, allyl alcohol, pentaerythritol tri(meth)acrylate, 4-hydroxy($C_1$- $C_{12}$)alkylstyrene, 4-hydroxystyrene and hydroxycyclohexyl(meth)acrylate. --, therefor. |
| 29 | 16 (Approx.) | In Claim 6, delete "E is a straight-chain, branched or cyclic alkylene group," and insert the same on Line 17 (Approx.) as a new line. |
| 29 | 37 (Approx.) | In Claim 7, delete "of(meth)acrylic" and insert -- of (meth)acrylic --, therefor. |
| 30 | 14 | In Claim 12, after "$R^{15}$" insert -- is --. |
| 30 | 32 | In Claim 12, after "$R^{17}$" insert -- is --. |
| 30 | 56 | In Claim 17, delete "forte" and insert -- for the --, therefor. |
| 31 | 32 | In Claim 17, delete "5of" and insert -- 5 of --, therefor. |
| 31 | 66 | In Claim 17, delete "forms" and insert -- form --, therefor. |
| 32 | 31 | In Claim 17, delete "we" and insert -- are --, therefor. |
| 32 | 35 | In Claim 17, delete "(IL)" and insert -- (II) --, therefor. |
| 32 | 50 (Approx.) | In Claim 17, delete "und" and insert -- and --, therefor. |
| 32 | 60 | In Claim 17, delete "0or an" and insert -- 0 or an --, therefor. |
| 32 | 61 | In Claim 17, delete "1to 5 an" and insert -- 1 to 5 --, therefor. |
| 32 | 64 | In Claim 17, delete "-hexaaryl biimidazoles," and insert -- -hexaarylbiimidazoles, --, therefor. |

| | | |
|---|---|---|
| 33 | 9-12 | In Claim 17, delete "(v) at least one solvent, and additionally comprising at least one component with at least one ethylenically unsaturated free-radical polymerizable group and at least one P—OH group." and insert<br>-- (v) at least one solvent, and<br>additionally comprising at least one<br>    component with at least one ethylenically<br>    unsaturated free-radical polymerizable<br>    group and at least one P—OH group, --, therefor. |